(12) United States Patent
Gottmann et al.

(10) Patent No.: US 7,382,523 B2
(45) Date of Patent: Jun. 3, 2008

(54) BEAM-GUIDING AND/OR FREQUENCY-CONVERTING OPTICAL SYSTEM AND METHOD FOR PRODUCING THE SAME

(75) Inventors: Jens Gottmann, Aachen (DE); Hans-Dieter Hoffmann, Simmerath (DE); Peter Russbuldt, Düren (DE); Christian Scholz, Aachen (DE); Markus Baumann, Mülheim-Kärlich (DE); Konstantin Boucke, Aachen (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/505,096

(22) PCT Filed: Jan. 10, 2003

(86) PCT No.: PCT/DE03/00053

§ 371 (c)(1),
(2), (4) Date: Apr. 8, 2005

(87) PCT Pub. No.: WO03/073147

PCT Pub. Date: Sep. 4, 2003

(65) Prior Publication Data

US 2005/0162731 A1   Jul. 28, 2005

(30) Foreign Application Priority Data

Feb. 21, 2002 (DE) .............................. 102 07 334
Nov. 16, 2002 (DE) .............................. 102 53 515

(51) Int. Cl.
*G02F 1/35* (2006.01)
*H01S 3/10* (2006.01)

(52) U.S. Cl. ............... 359/326; 359/328; 359/330; 372/22

(58) Field of Classification Search .......... 359/326, 359/328, 330; 372/21, 22
See application file for complete search history.

(56) References Cited

U.S. PATENT DOCUMENTS 4,286,838 A * 9/1981 Huignard et al. .......... 372/50.1

(Continued)

FOREIGN PATENT DOCUMENTS

EP   0 502 682 A2   9/1992
EP   0 943 943 A2   9/1999

OTHER PUBLICATIONS

Patent Abstracts of Japan for JP 62086881 A (Matsushita Electric Ind Co Ltd) Apr. 21, 1987.

(Continued)

*Primary Examiner*—Hemang Sanghavi
(74) *Attorney, Agent, or Firm*—Breiner & Breiner, LLC

(57) ABSTRACT

The present invention relates to a beam-guiding and/or frequency-converting optical system as well as to a method of manufacturing same, wherein a beam-emitting optoelectronic component (1), which comprises at least one beam-emerging surface (2) for the emergence of a beam, is provided and connected to a surface (5) of a base (4) in such a manner that the emerging beam extends approximately in parallel with the surface (5) of said base (4). Once the optoelectronic component (1) has been connected to said base (4), a wave-guiding stratified system (4) is deposited and structured and/or locally modified on the surface (5) of said base (4) for guidance and/or frequency conversion of the beam in such a way that a gap-free contact is created between said beam exit surface (2) and said stratified (6) and a pre-determinable beam guidance is achieved.

4 Claims, 2 Drawing Sheets

U.S. PATENT DOCUMENTS

| | | | | |
|---|---|---|---|---|
| 5,172,385 A | * | 12/1992 | Forrest et al. | 372/50.21 |
| 5,379,311 A | | 1/1995 | McFarlane et al. | |
| 5,379,359 A | * | 1/1995 | Gupta | 385/49 |
| 5,506,722 A | * | 4/1996 | Mizuuchi et al. | 359/332 |
| 6,340,605 B1 | | 1/2002 | Kawanishi et al. | |
| 6,836,497 B1 | * | 12/2004 | Hatori | 372/43.01 |

OTHER PUBLICATIONS

Patent Abstracts of Japan for JP 04287389 A (NEC Corp) Oct. 12, 1992.

Patent Abstracts of Japan for JP 63182882 A (Toshiba Corp) Jul. 28, 1988.

Patent Abstracts of Japan for JP 2001332808 A (Minolta Co Ltd) Nov. 30, 2001.

* cited by examiner

BEAM-GUIDING AND/OR FREQUENCY-CONVERTING OPTICAL SYSTEM AND METHOD FOR PRODUCING THE SAME

FIELD OF THE INVENTION

The present invention relates to a method of manufacturing a beam-guiding and/or frequency-converting optical system wherein a beam-emitting optoelectronic component is provided, which comprises at least one beam exit surface for the emergence of a beam, and connected to the surface of a base in such a way that the emerging beam extends approximately in parallel with the surface of the base. The invention relates moreover to a beam-guiding and/or frequency converting optical system that can be produced by this method.

Guiding and converting electromagnetic radiation from optoelectronic components such as semiconductor diode lasers plays an important role in many fields in technology where optoelectronic components are employed. In these methods, the radiation emerging from the optoelectronic component is, as a rule, guided or shaped by further optical components in order to achieve the beam characteristics required for the respective application. In many cases, conversion of the frequency of the radiation emerging from the optoelectronic component into a higher or lower frequency is equally required.

PRIOR ART

As a rule, further discrete optical components such as lenses, optical waveguide fibres or frequency-doubling crystals are provided in a discrete optical structure for guiding and converting the electromagnetic radiation from optoelectronic components. In these systems, the optoelectronic component and likewise the beam-guiding or frequency-converting components are mounted and adjusted on a base. The provision of an optical system in which the radiation of the optoelectronic component is shaped and guided by means of lenses and/or mirrors and coupled into optical guiding fibres requires a great number of adjusting steps. For example, the optoelectronic component must initially be aligned and mounted on the base. Then the lenses and/or mirrors are adjusted in succession, relative to the optoelectronic component, and fixed on the base. Subsequently, the optical waveguide fibre is adjusted and mounted on the base. The precise adjustment and mounting of the individual discrete components is a tedious and expensive operation susceptible to faults. Moreover, undesirable optical losses occur between the separate components, which are caused, for instance, by reflection, scattering and diffraction of the light.

The German Patent DE 695 10 238 T2 discloses a microchip laser that includes one or several integrated beam-shaping or frequency-converting elements, respectively. Microchip lasers consist of combined polished dielectric materials such as laser crystals or frequency-doubling crystals that are pumped by high-power diode lasers. For example, the German Patent DE 695 10 238 T2 discloses a microchip laser that is substantially composed of a layer of amplifying material, a layer of a carrier material, e.g. quartz crystal, and a layer consisting of a frequency-doubling crystal. The layer of the carrier material serves to mount the laser on a base or substrate on which the diode pumping laser is mounted as well. When the carrier layer is configured on one end of the microchip laser it may assume, at the same time, the function of a beam-shaping lens if it is appropriately shaped. For the production of such a microchip laser it is necessary that the contact surfaces of the crystals used as amplifying layer and as frequency-doubling layer and of the carriers are highly polished and plane in order to ensure that the materials will be joined by Van-der-Waals forces when they are compressed. The production of such a microchip laser is therefore expensive. With comparable output power, microchip lasers achieve a distinctly improved beam quality, compared against laser diodes, in the visible spectral range. The insufficient stability of the beam axis (beam point stability) of these lasers is, however, a disadvantage that precludes many potential applications, e.g. in metrology such as laser triangulation and in printing technology.

Another known beam-guiding and/or frequency-converting optical system makes use of the technique of bonded waveguides. Bonded planar waveguides and waveguide lasers are composed of thin polished mono-crystals and pumped by means of high-power diode lasers via a beam-shaping stage consisting of two cylinder lenses. One example of the application of this technology of bonded waveguides is known, for instance, from C. Li et al. "Longitudinally Diode-Pumped High-Power Waveguide Lasers" in: Proceedings $10^{th}$ European Conference on Integrated Optics, Paderborn, Germany, pages 83 to 86, 2001. The waveguide lasers used in this technique consist of a combination of layers of sapphire, YAG, Nd:YAG, YAG and sapphire, with the individual layers presenting a thickness as small as roughly 5 to 20 µm, at an area in the range of square centimetres. With such waveguide lasers power levels above 1 Watt can be achieved at a wave-length of 1064 nm almost with restriction of diffraction. This concept involves, however, the disadvantage of the extremely expensive thin design of the crystal platelets and the expensive and tedious adjustment and mounting work resulting in a very high expenditure in terms of manufacture.

Starting out from such prior art, the present invention is based on the problem of providing a method of producing a beam-guiding and/or frequency-converting optical system that requires only a slight expenditure in terms of manufacture and furnishes a highly efficient optical system. Moreover, a beam-guiding and/or frequency-converting, highly efficient optical system is envisaged that can be produced by this method.

DESCRIPTION OF THE INVENTION

Expedient embodiments of the method as well as of the system are the subject matters of the dependent claims or can be derived from the following description and the embodiments.

In the present method of manufacturing a beam-guiding and/or frequency-converting optical system, a beam-emitting optoelectronic component is provided that is provided with at least one beam exit surface for the emergence of a beam and is connected to a surface of a base in such a way that the emerging beam extends approximately in parallel with the surface of the base. Once the optoelectronic component has been connected to the base, for instance a carrier substrate, an optical wave-guiding stratified system composed of several layers is deposited and structured and/or locally modified on the surface of the base for guidance and/or frequency conversion of the beam in such a manner that a gap-free contact is created between the beam exit surface of the optoelectronic component and the stratified system whilst a beam guidance is achieved that can be predetermined. With the present method hence a novel system is provided that consists of optical waveguides ahead of optoelectronic beam sources for guiding and/or converting the light of the beam source, wherein the waveguides are manufactured in direct contact with the beam source by depositing and structuring a layer and/or by modifying the stratified system on a common base. The individual layers of the stratified system are preferably made of glass-like, ceramic or polymer materials, which must, of course, permit the transmission of the light for beam guidance or frequency conversion, respectively. In distinction from the technique of manufacturing micro chip lasers, which has been described by way of introduction, the present method involves a hybrid rather than a monolithic integration of optical and optoelectronic components.

One essential advantage of the present method and the appertaining system resides in an improvement of the efficiency of the optical system because coupling losses between the optoelectronic component and the wave-guiding stratified system are avoided by the direct contact, which losses are unavoidable in the case of a discrete optical structure. Moreover, the present method results in an improvement of the efficiency in the manufacture of such optical systems because the hybrid integration of the wave-guiding structures with the optoelectronic component on a common base saves expensive and complex adjusting and mounting operations. The present method presents also advantages over the techniques of manufacturing micro chip lasers or bonded waveguides because the complex polishing and adjustment of the beam-guiding or frequency-converting wave-guiding structure is not required.

One or several ones among the layers of the wave-guiding stratified system are so structured in the present method that the resulting wave-guiding structure permits the desired guidance or shaping of the beam emerging from the optoelectronic component. The suitable selection of the materials and dimensions of this stratified structure are common to those skilled in the art. The wave-guiding stratified system preferably consists of at least three superimposed layers whereof the middle layer has a refractive index higher than the index of the two neighbouring layers. Individual layers of the wave-guiding stratified system or of the entire stratified system, respectively, can be structured already by depositing in a structured manner, using one or several masks. Moreover, the layers can also be structured by removing processes in an appropriate manner after the layers have been deposited. A local modification of the characteristics of the deposited layers, for instance under the influence of laser radiation for a local variation of the refractive index, is possible, of course, too.

For both depositing the layers and for structuring or modification processes are employed that do not impair the function of the optoelectronic device or the connection between the optoelectronic device and the base. High temperatures and strong electric fields in particular must be avoided in this operation. For this reason, methods are preferably applied which operate on hyperthermic particles such as high-speed ions and on pulsed laser radiation, for instance methods of laser deposition, ion beam deposition, of cathodic sputtering, of reactive ion etching or of removal or variation of the refractive index by means of pulsed laser radiation. For the manufacture of the gap-free contact between the wave-guiding stratified system and the at least one beam exit surface of the optoelectronic component one should select a substantially directional deposition at an angle that is approximately parallel to the beam exit surface of the optoelectronic component.

For a frequency-converting function, preferably a wave-guiding stratified system is deposited, wherein at least one layer is formed of a laser-active material—which means a fluorescent material, for instance—that can be excited by the frequency of the beam emerging from the optoelectronic component (first frequency) and is emissive in response to excitation with a radiation presenting a higher or lower frequency (second frequency). In this manner, the first frequency of the beam emerging from the optoelectronic device can be converted into a second frequency that emerges then on a beam exit side of the wave-guiding stratified structure. Suitable materials for such a so-called up-conversion or down-conversion are common to those skilled in the art.

According to another embodiment of the present method or of the appertaining optical system, the beam exit side of the wave-guiding stratified system, which comprises at least one layer of a laser-active material, is coated with a layer reflecting the radiation of the second frequency so that the beam exit surface of the optoelectronic component is used to form an optical resonator for the radiation of the second frequency. Whenever necessary for the function as resonator, the beam exit surface of the optoelectronic component may be coated with an additional layer for reflection of the second frequency, prior to the application of the stratified system on the base. In this manner, a waveguide laser is formed y the save-guiding structure, which is pumped by the optoelectronic component. To this end, the coating that is possibly applied on the beam exit surface of the optoelectronic component for reflection of the second frequency, must, of course, be transmitting for the first frequency. According to another embodiment, it is also possible to add further mirrors by structuring, polishing and/or subsequent coating with dielectric or metallic layers. One mirror may be formed, for instance, by a structure in the form of a V-shaped retro reflector on the base.

Even though the above description refers essentially to an optoelectronic component with a beam exit surface via which a beam is emitted, it is, of course, also possible in the present method and the appertaining system to use optoelectronic components, too, which emit several beams via several beam exit surfaces. The optoelectronic component may be an isolated semiconductor diode laser with several beam exit surfaces, for example, or may be composed of several beam sources in succession. The application of an optoelectronic component including several beam sources, particularly in the form of semiconductor diode lasers, offers advantages specifically when a waveguide laser is pumped that is formed by the wave-guiding stratified system. One essential feature of the present method is the application of an optoelectronic component completely finished, i.e. fully operable, which may be commercially available, for instance, and is mounted on the base.

When an optoelectronic component is used that emits several beams via several beam exit surfaces the wave-guiding stratified system is so deposited and structured that all the emerging beams are guided in the desired manner in this wave-guiding stratified system. In one expedient embodiment, the individual beams are converged through the wave-guiding stratified system on a reduced beam exit surface so that one beam with a small cross-sectional area and a high intensity is available on the beam exit side of the wave-guiding stratified system. The wave-guiding stratified system is designed in the form of a beam coupler in this case.

A metal or dielectric substrate, in particular a cooling body, is preferably used as base. With this configuration, improved cooling of the optical system is achieved at the same time. When the base is designed as cooling body it may present, for instance, cooling fins on the underside or integrated cooling passages or any other means for cooling. The connection between the base and the optoelectronic component may be achieved, for instance, via a soldered or adhesive connection.

BRIEF DESCRIPTION OF THE DRAWINGS

The present method as well as the appertaining system will be briefly described again in the following by embodiments, with reference to the drawings, without a restriction of the general inventive idea. In the drawing.

WAYS OF REALISING THE INVENTION

Figure 1:
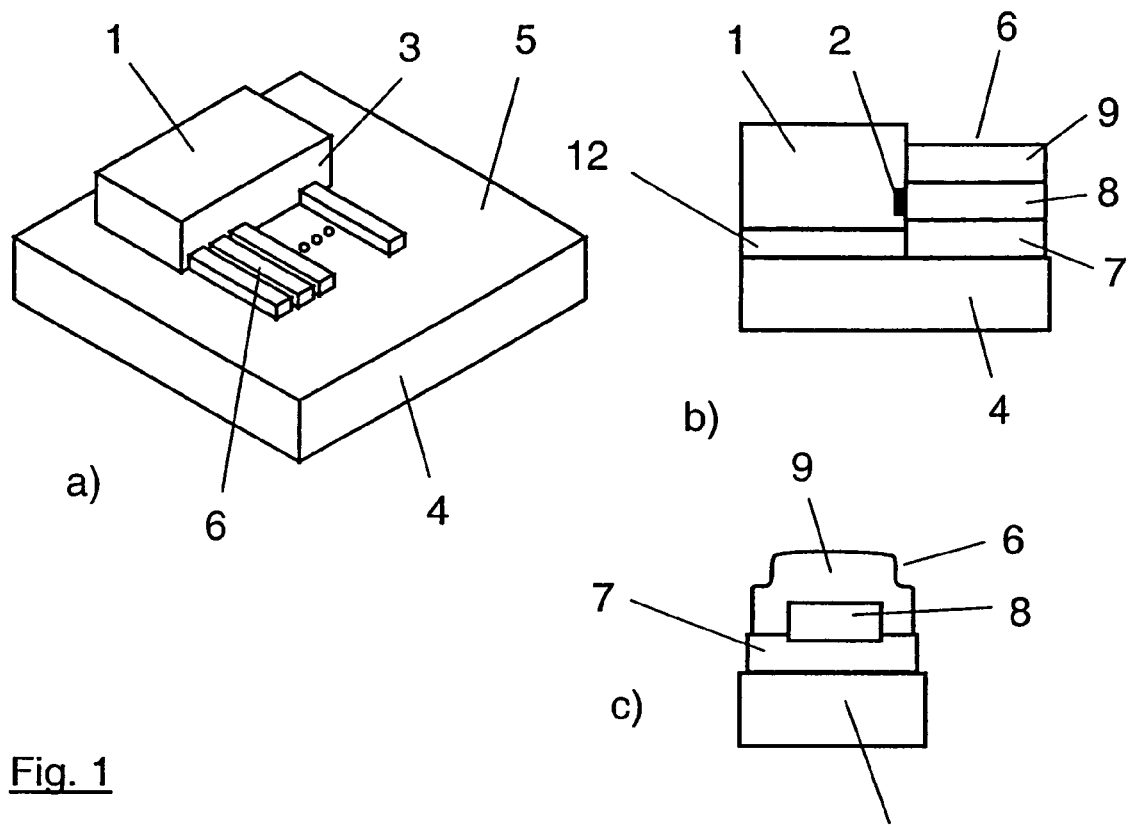
FIGS. 1a) to 1c) show different views of an optical system according to the present invention.

FIG. 1 shows different schematic views of an example of an optical system according to the present invention. The partial view (a) illustrates a perspective view of such an optical system. In this partial view, the beam-emitting optoelectronic component 1—which is a semiconductor diode laser with several beam exit surfaces for the emission of several beams in side-by-side relationship in the present case—can be clearly seen, which is mounted on the surface 5 of a base 4. A wave-guiding structure in the form of a wave-guiding stratified system 6 is applied on the beam exit surface 3 of the optoelectronic component, in direct contact with the beam exit surfaces of the optoelectronic component 1. The individual beams emerging from the optoelectronic component 1 are guided here by the juxtaposed waveguides of the wave-guiding stratified system 6, which are formed in the present example.

In the partial view (b), this arrangement is illustrated again in cross-section along the beam axes of the beams emerging from the optoelectronic component 1. In this illustration, the connecting layer 12 between the optoelectronic component 1 and the base 4 can be seen. The wave-guiding stratified system 6 consists of three superimposed layers 7 to 9 whereof the middle layer 8 has a refractive index higher than the refractive index of the neighbouring layers 7, 9. In this manner, a waveguide is formed for the radiation emerging from the optoelectronic component 1 via the beam exit surface 2 visible here. The middle layer 8 is in direct contact with the beam exit surface 2.

The partial view (c) shows again one part of this optical system in a sectional view along the beam axis. In this illustration, the waveguide formed by the wave-guiding stratified system 6 for a single beam of the optoelectronic component 1 can be clearly seen. By means of depositing the individual layers 7 to 9 of this wave-guiding stratified system 6, the effect can be achieved that the middle layer region 8 is completely surrounded by the neighbouring layers 7 and 9.

Figure 2A:
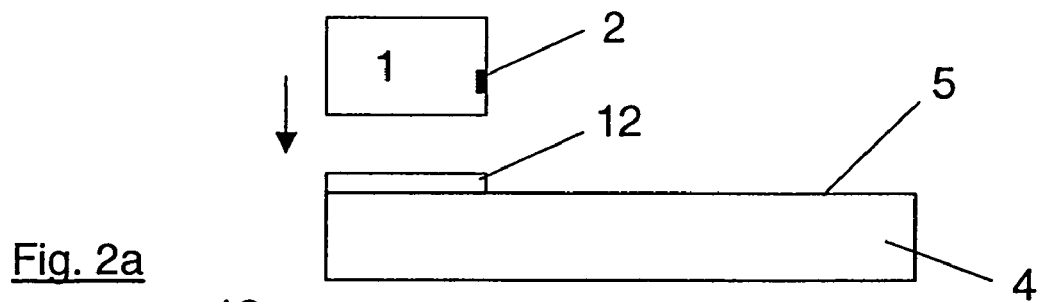
FIGS. 2a to 2e illustrate individual exemplary steps of operation according to the present method for the manufacture of an optical system according to FIG. 1.

FIG. 2(a) is an exemplary illustration of one possibility to manufacture the optical system shown in FIG. 1 in accordance with the present method. In the first step (FIG. 2a), a solder layer 12 is applied on one region on a base 4 and subsequently, the optoelectronic component 1 is connected to the base 4 via this solder layer 12 so that a free surface of the base 4 is located ahead of the beam exit surface 2 of the optoelectronic component 1, seen along the beam direction.

Figure 2B:
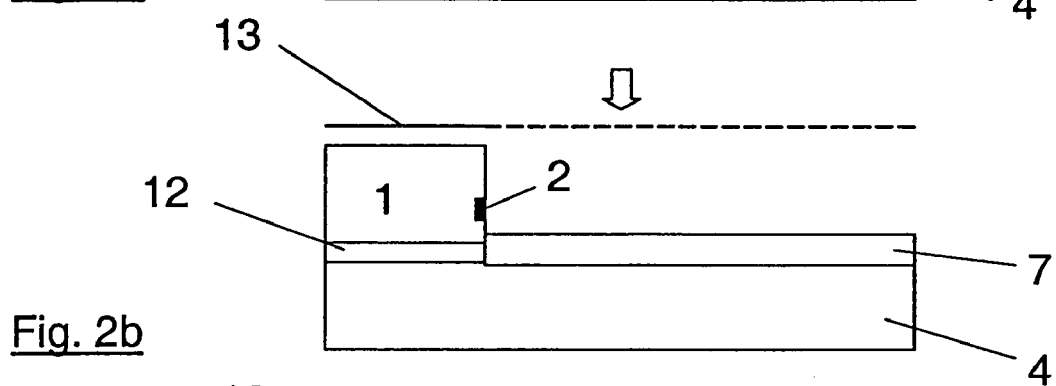
Figure 2C:
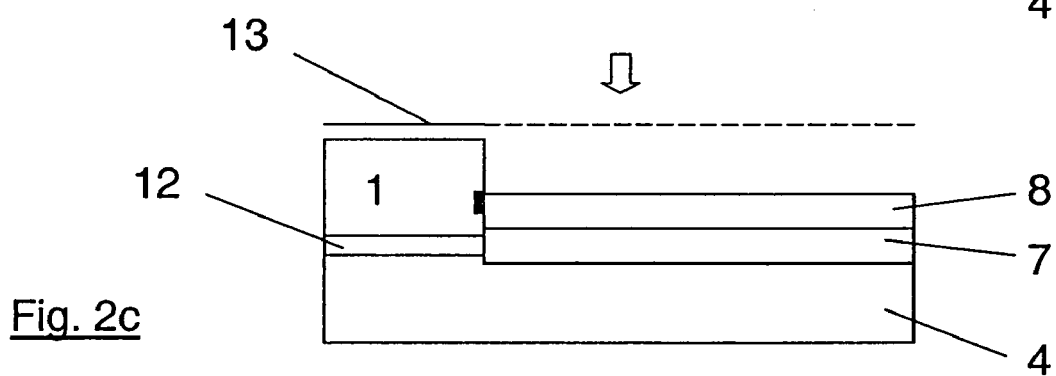

Then, an optically wave-guiding stratified system 6 is located on the base 4 ahead of the optoelectronic device 1 in such a manner that the radiation emerging from the beam exit surface 2 is guided within the layers. The propagation of the radiation is restricted, in a manner known per se, to desired directions. Initially, a bottom layer 7 of the stratified system 6 is deposited via a mask 13 in direct contact with the optoelectronic device 1 on the surface 5 of the base 4 FIG. 2b). Once the bottom layer 7 has been deposited, a middle layer 8 is deposited by means of a mask 13 in the same manner, which middle layer covers, in particular, the optoelectronic component 1 (FIG. 2c).

Figure 2D:
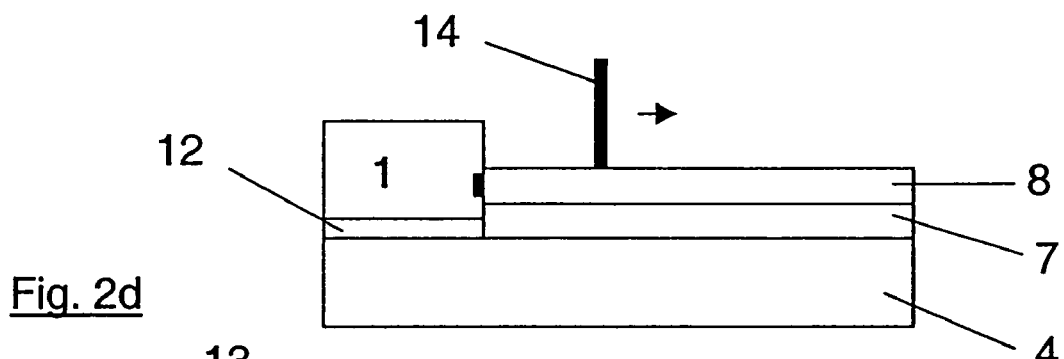
Figure 2E:
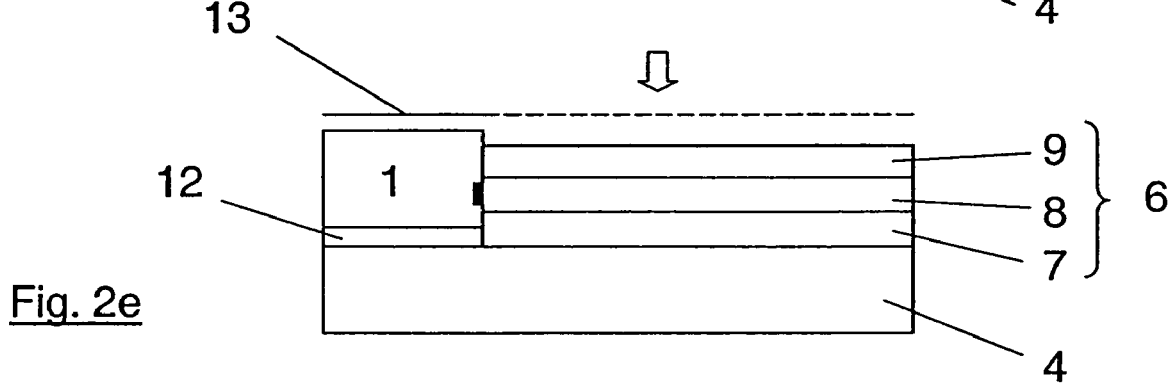

In the present example, the middle layer 8 is subsequently structured by means of a laser beam 14 (FIG. 2d) so as to create waveguides in side-by-side relationship, as is roughly indicated, too, in the partial view (a) of FIG. 1. Finally, the top layer 9 is deposited, in turn via the mask 13, so that the arrangement of the wave-guiding structure 6 is achieved, which is illustrated in FIG. 1.

In this example, the individual layers 7 to 9 of the stratified system 6 are deposited by an appropriate plasma depositing technique, e.g. laser deposition, whilst the middle layer 9 is structure, for instance, by laser ablation.

Figure 3:
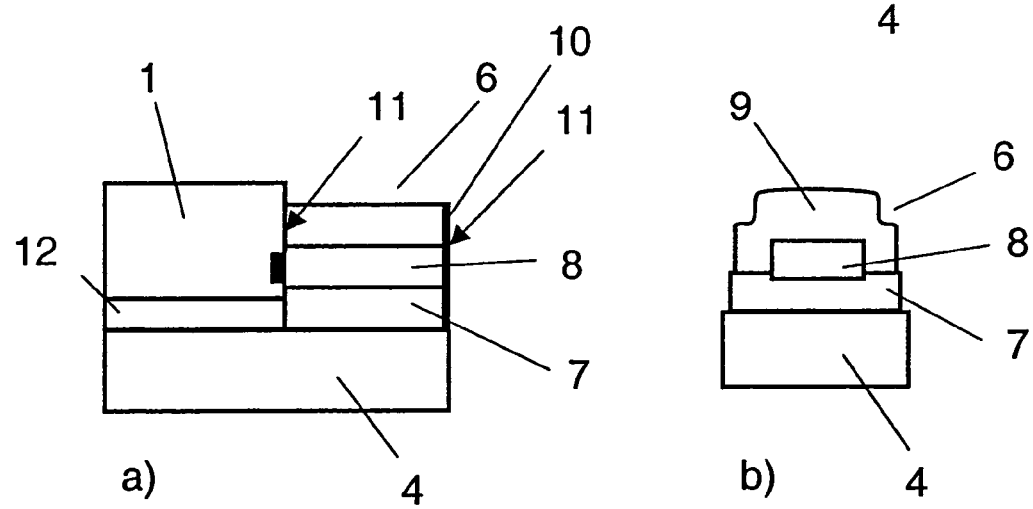
FIGS. 3a) and 3b) show one example of an optical system with a waveguide laser according to the present invention.

FIG. 3 illustrates eventually a further example of an optical system according to the present invention, equally in two partial views (a) and (b) corresponding to the views (b) and (c) of FIG. 1. In this example, the middle layer 8 of the wave-guiding stratified system 6 consists of a laser-active material that can be pumped by the radiation of the optoelectronic component 1 acting as pumping source. The partial view (a) moreover illustrates roughly two resonator mirrors in the form of coatings 11 on the beam exit side 10 of the wave-guiding stratified system 6 as well as on the beam exit side 3 of the optoelectronic device 1. Due to these resonator mirrors, the wave-guiding stratified system 7 represents a waveguide laser that is realised in direct contact with the pumping beam source, i.e. the optoelectronic component 1, on a common base 4. When the two resonator mirrors 11 are omitted it is possible to achieve a simple frequency conversion of the radiation of the optoelectronic component 1 in this manner. The partial view (b) illustrates again the fundamental structure of the wave-guiding stratified system 6 for a beam, in a section taken in a direction orthogonal on the beam direction.

LIST OF REFERENCE NUMERALS

| | |
|---|---|
| 1 | optoelectronic component |
| 2 | beam exit surface |
| 3 | beam exit side of the optoelectronic component |
| 4 | base or carrier substrate |
| 5 | surface of the base |
| 6 | wave-guiding stratified system |
| 7 | bottom layer |
| 8 | middle layer |
| 9 | top layer |
| 10 | beam exit side of the wave-guiding stratified system |
| 11 | (partially) reflecting coating (resonator mirror) |
| 12 | connecting layer |
| 13 | mask |
| 14 | laser beam |

The invention claimed is:

1. Method of manufacturing a beam-guiding and/or frequency-converting optical system comprising providing a beam-emitting optoelectronic component comprising at least one beam exit surface for emergence of a beam, and connecting the optoelectronic component to a surface of a base in such a manner that the beam emerging from the at least one beam exit surface extends approximately in parallel with the surface of said base, wherein after establishing connection of said optoelectronic component with said base, a wave-guiding stratified system composed of several layers is deposited and structured and/or locally modified on the surface of said base for guidance and/or frequency conversion of the beam, in such a manner to create a gap-free contact between said at least one beam exit surface and said stratified system and achieve a pre-determinable beam guidance, and wherein modification of said stratified system is by locally restricted influence of energy for varying refractive index of a layer.

2. The method according to claim 1, wherein low-temperature processes are employed for depositing and structuring and/or local modification of said stratified system.

3. Method of manufacturing a beam-guiding and/or frequency-converting optical system comprising providing a beam-emitting optoelectronic component comprising at least one beam exit surface for emergence of a beam, and connecting the optoelectronic component to a surface of a base in such a manner that the beam emerging from the at least one beam exit surface extends approximately in parallel with the surface of said base, wherein after establishing connection of said optoelectronic component with said base, a wave-guiding stratified system composed of several layers is deposited and structured and/or locally modified on the surface of said base for guidance and/or frequency conversion of the beam, in such a manner to create a gap-free contact between said at least one beam exit surface and said stratified system and achieve a pre-determinable beam guidance, wherein a plurality of said at least one beam exit surface is used, with said wave-guiding stratified system being structured and/or locally modified for guidance and/or frequency conversion of beams emerging from said plurality of beam exit surfaces, and wherein said wave-guiding stratified system is structured and/or locally modified so that the beams emerging from said plurality of exit surfaces converge onto a reduced beam exit surface.

4. A beam-guiding and/or frequency-converting optical system comprising a beam-emitting optoelectronic component comprising at least one beam exit surface for emergence of a beam, connected to a surface of a base in such a manner that the beam emerging extends approximately in parallel with the surface of said base, and a wave-guiding stratified system composed of a plurality of layers in gap-free contact with said at least one beam exit surface deposited on the surface of said base for guidance and/or frequency conversion of the beam, wherein said optoelectronic component includes a plurality of beam exit surfaces, with said wave-guiding stratified system being structured and/or locally modified for guidance and/or frequency conversion of the beams emerging from said plurality of beam exit surfaces, and wherein said wave-guiding stratified system is structured and/or locally modified so that the beams emerging from said plurality of beam exit surfaces converge onto a reduced beam exit surface.

* * * * *

UNITED STATES PATENT AND TRADEMARK OFFICE
CERTIFICATE OF CORRECTION

| | |
|---|---|
| PATENT NO. | : 7,382,523 B2 |
| APPLICATION NO. | : 10/505096 |
| DATED | : June 3, 2008 |
| INVENTOR(S) | : Jens Gottmann et al. |

It is certified that error appears in the above-identified patent and that said Letters Patent is hereby corrected as shown below:

On the title page under item (86) insert the following:

"§ 371 (c) (1), (2), (4) Date:   Apr. 8, 2005" should read
-- § 371 (c) (1), (2), (4) Date:   Oct. 12, 2004 --

Signed and Sealed this

Second Day of June, 2009

JOHN DOLL
*Acting Director of the United States Patent and Trademark Office*